US011722127B2

United States Patent
Lee et al.

(10) Patent No.: US 11,722,127 B2
(45) Date of Patent: Aug. 8, 2023

(54) PHASE INTERPOLATOR AND PHASE BUFFER CIRCUIT

(71) Applicant: REALTEK SEMICONDUCTOR CORPORATION, Hsinchu (TW)

(72) Inventors: Yuan-Sheng Lee, Hsinchu (TW); Yao-Chia Liu, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/880,828

(22) Filed: Aug. 4, 2022

(65) Prior Publication Data

US 2023/0133933 A1  May 4, 2023

(30) Foreign Application Priority Data

Oct. 29, 2021  (TW) .................................. 110140264

(51) Int. Cl.
*H03K 5/135* (2006.01)
*H03K 5/00* (2006.01)

(52) U.S. Cl.
CPC ... *H03K 5/135* (2013.01); *H03K 2005/00052* (2013.01)

(58) Field of Classification Search
None
See application file for complete search history.

(56) References Cited

U.S. PATENT DOCUMENTS

2009/0251189 A1* 10/2009 Hsieh ....................... H03K 5/13
327/296

FOREIGN PATENT DOCUMENTS

CN   108832913 A   11/2018

OTHER PUBLICATIONS

OA letter of a counterpart TW application (appl. No. 110140264) mailed on Aug. 22, 2022. Summary of the TW OA letter: 1. Claims 1 and 3-9 are rejected as allegedly being anticipated by cited reference 1 (CN 108832913 A). 2. Claims 2 and 10 are allowable. PS. Correspondence bewteen claims of TW counterpart application and claims of US application: 1. Claims 1-10 in TW counterpart application correspond to claims 1-10 in US application, respectively.

* cited by examiner

*Primary Examiner* — Cassandra F Cox
(74) *Attorney, Agent, or Firm* — WPAT, P.C

(57) ABSTRACT

A phase interpolator includes phase interpolator circuitries. The phase interpolator circuitries generate an output clock signal from an output node according to phase control bits and clock signals. Phases of the clock signals are different from each other. Each phase circuitry includes phase buffer circuits. Each phase buffer circuit is turned on according a first bit and a second bit of the phase control bits, in order to generate a signal component in the output clock signal according to a corresponding clock signal of the clock signals. Each phase buffer circuit includes a first resistor and a second resistor, and transmits one of a first voltage and a second voltage to the output node according to the corresponding clock signal, in which the first voltage is transmitted to the output node via the first resistor, and the second voltage is transmitted to the output node via the second resistor.

11 Claims, 4 Drawing Sheets

PHASE INTERPOLATOR AND PHASE BUFFER CIRCUIT

BACKGROUND OF THE INVENTION

1. Field of the Invention

The present disclosure relates to a phase interpolator, especially to a phase interpolator and a phase buffer circuit that have high linearity.

2. Description of Related Art

Conventional phase interpolators often utilize differential pair circuits and current source circuits to control current, and convert the current through resistors to generate an output clock signal. These circuits are charged by current and discharged by resistors. The above charging and discharging behaviors will lead to the asymmetry of charging and discharging rate or time constant and thus affect the linearity. In other approaches, phase interpolators are implemented with inverter-based circuits. However, under the impacts of process variations, the offset of P-type transistor and that of N-type transistors are not the same. As a result, an output common mode level of the phase interpolator will be inaccurate. In addition, if the swing of the output clock signal is too high, transistor(s) in the differential pair and/or the current source circuit may operate in the nonlinear region, which results in a poor linearity of the output clock signal.

SUMMARY OF THE INVENTION

In some aspects of the present disclosure, a phase interpolator includes a plurality of phase interpolator circuitries. The plurality of phase interpolator circuitries are configured to generate an output clock signal from an output node in response to a plurality of phase control bits and a plurality of clock signals. Phases of the plurality of clock signals are different from each other. Each of the plurality of phase interpolator circuitries includes a plurality of phase buffer circuits, each of the plurality of phase buffer circuits is configured to be turned on according to a first bit and a second bit in the plurality of phase control bits, in order to generate a signal component of the output clock signal to the output node according to a corresponding clock signal in the plurality of clock signals, each of the plurality of phase buffer circuits includes a first resistor and a second resistor and is configured to transmit one of a first voltage and a second voltage to the output node according to the corresponding clock signal, the first voltage is transmitted to the output node via the first resistor, and the second voltage is transmitted to the output node via the second resistor.

In some aspects of the present disclosure, a phase buffer circuit includes a first resistor, a second resistor, a first switch, a second switch, a third switch, and a fourth switch. A terminal of the first resistor is configured to receive a first voltage. A terminal of the second resistor is configured to receive a second voltage. A first terminal of the first switch is coupled to another terminal of the first resistor, and a control terminal of the first switch is configured to receive a clock signal. A first terminal of the second switch is coupled to a second terminal of the first switch, a second terminal of the second switch is coupled to an output node to generate a signal component, and a control terminal of the second switch is configured to receive a first phase control bit. A first terminal of the third switch is coupled to the output node, and a control terminal of the third switch is configured to receive a second phase control bit. A first terminal of the fourth switch is coupled to a second terminal of the third switch, a second terminal of the fourth switch is coupled to another terminal of the second resistor, and a control terminal of the fourth switch is configured to receive the clock signal.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuitry" may indicate a system formed with at least one circuit, and the term "circuit" may indicate an object, which is formed with one or more transistors and/or one or more active/passive elements based on a specific arrangement, for processing signals.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, like elements in various figures are designated with the same reference number.

Figure 1:
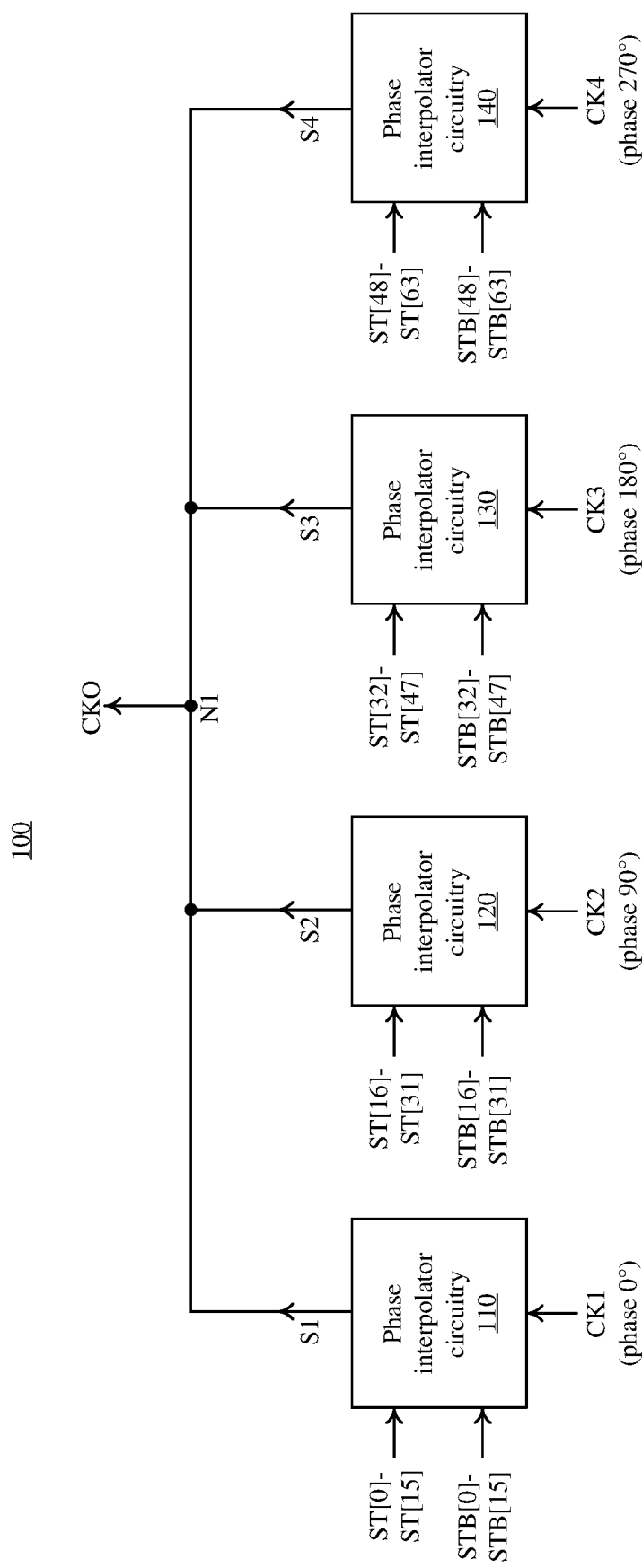
FIG. 1 illustrates a schematic diagram of a phase interpolator according to some embodiments of the present disclosure.

FIG. 1 illustrates a schematic diagram of a phase interpolator 100 according to some embodiments of the present disclosure. The phase interpolator 100 includes phase interpolator circuitries 110, 120, 130, and 140. The phase interpolator circuitries 110, 120, 130, and 140 are configured to generate an output clock signal CKO from an output node N1 in response to phase control bits ST[0]-ST[63] and STB[0]-STB[63] and clock signals CK1-CK4.

In some embodiments, phases of the clock signals CK1-CK4 are different from each other. For example, the phase of the clock signal CK1 is about 0 degree, the phase of the clock signal CK2 is about 90 degrees, the phase of the clock signal CK3 is about 180 degrees, and the phase of the clock signal CK4 is about 270 degrees. In some embodiments, a corresponding one of the phase control bits ST[0]-ST[63] and a corresponding one of the phase control bits have opposite logic values. For example, when the phase control bit ST[0] has a logic value of 1, the control phase bit STB[0] has a logic value of 0. Alternatively, when the phase control bit ST[0] has the logic value of 0, the phase control bit STB[0] has the logic value of 1. With this analogy, it should be understood the corresponding relation among the remaining phase control bits ST[1]-ST[63] and STB[1]-STB[63].

In greater detail, the phase interpolator circuitry 110 generates a signal component S1 in response to the phase control bits ST[0]-ST[15] and STB[0]-STB[15] and the clock signal CK1, and outputs the signal component S1 to the output node N1. The signal component S1 is configured to form the output clock signal CKO. In other words, the signal component S1 is a part of the output clock signal CKO. The phase control bits ST[0]-ST[15] (and/or the phase control bits STB[0]-STB[15]) may be configured to set the ratio of the clock signal CK1 to the output clock signal CKO. For example, if the number of bits having predetermined logic values (e.g., the logic value of 0) in the phase control bits ST[0]-ST[15] is higher, the ratio of the clock signal CK1 to the output clock signal CKO is higher. Alternatively, if the number of bits having the predetermined logic value (e.g., the logic value of 0) in the phase control bit ST[0]-ST[15] is lower, the ratio of the clock signal CK1 to the clock signal CKO is lower.

Similarly, the phase interpolator circuitry 120 generates a signal component S2 in response to the phase control bits ST[16]-ST[31] and STB[16]-STB[31] and the clock signal CK2, and outputs the signal component S2 to the output node N1. The phase interpolator circuitry 130 generates a signal component S3 in response to the phase control bits ST[32]-ST[47] and STB[32]-STB[47] and the clock signal CK3, and outputs the signal component S3 to the output node N1. The phase interpolator circuitry 140 generates a signal component S4 in response to the phase control bits ST[48]-ST[63] and STB[48]-STB[63] and the clock signal CK4, and outputs a signal component S4 to the output node N1. The signal components S1-S4 may be summed up at the output node N1, in order to form the output clock signal CKO.

In some embodiments, each of the phase interpolator circuitries 110, 120, 130, and 140 includes phase buffer circuits (not shown in FIG. 1). Each phase buffer circuit includes a first resistor and a second resistor. The phase buffer circuit may transmit a corresponding one of a first voltage and a second voltage to the output node N1 according to a corresponding clock signal (i.e., a corresponding one of the clock signals CK1-CK4), in which the first voltage is transmitted to the output node N1 via the first resistor, and the second voltage is transmitted to the output node N1 via the second resistor. As a result, the first resistor and the second resistor may set a common mode level of the output node N1, and keep that common mode level under the impacts of process variations effectively, in order to increase the linearity and the available swing of the output clock signal CKO. The arrangements regarding herein will be given with reference to FIG. 3A and FIG. 3B.

Figure 2:
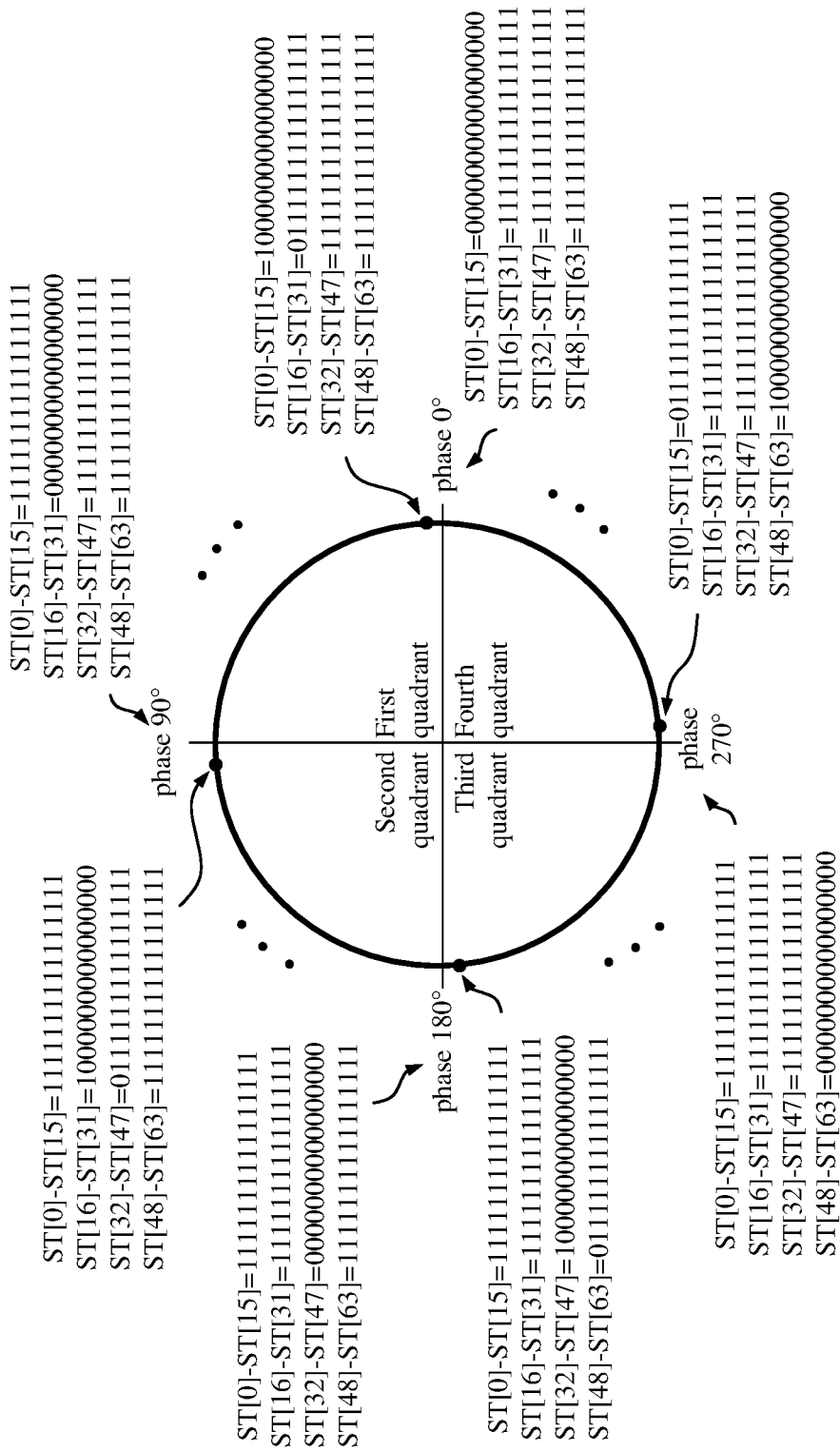
FIG. 2 illustrates a schematic diagram of relations among the phase of the output clock signal and the phase control bits in FIG. 1 according to some embodiments of the present disclosure.

FIG. 2 illustrates a schematic diagram of relations among the phase of the output clock signal CKO and the phase control bit ST[0]-ST[63] in FIG. 1 according to some embodiments of the present disclosure. As shown in FIG. 2, the phase of the output clock signal CKO may be divided into four quadrants. In a first quadrant, the phase of the output clock signal CKO is from 0 to 90 degrees. In a second quadrant, the phase of the output clock signal CKO is from 90 to 180 degrees. In a third quadrant, the phase of output clock signal CKO is from 180 to 270 degrees. In a fourth quadrant, the phase of output clock signal CKO is from 270 to 0 degrees.

In greater detail, when the phase control bits ST[0]-ST[15] all have first logic values (e.g., the logic value of 0, which may be the aforementioned predetermined logic value) and the remaining phase control bits ST[16]-ST[63] all have second logic values (e.g., the logic value of 1), the phase interpolator 100 may output the output clock signal CKO having the phase of 0 degree. Afterwards, a bit-shift operation may be performed on the phase control bit ST[0]-ST[63], in order to gradually increase the phase of the output clock signal CKO. When the phase control bits ST[16]-ST[31] have the predetermined logic values (e.g., the logic value of 0) and the remaining phase control bits ST[0]-ST[15] and ST[32]-ST[63] all have the second logic values (e.g., the logic value of 1), the phase interpolator 100 may output the output clock signal CKO having a phase of 90 degrees.

With this analogy, when the phase control bits ST[32]-ST[47] all have the predetermined logic values (e.g., the logic value of 0) and the remaining phase control bits ST[0]-ST[31] and ST[48]-ST[63] all have the second logic values (e.g., the logic value of 1), the phase interpolator 100 may output the output clock signal CKO having the phase of 180 degrees. When the phase control bits ST[48]-ST[63] all have the predetermined logic values (e.g., the logic value of 0) and the remaining phase control bits ST[0]-ST[47] all have the second logic values (e.g., the logic value of 1), the phase interpolator 100 may output the output clock signal CKO having the phase of 270 degrees.

The encoding of the phase control bits ST[0]-ST[63] in FIG. 2 are shown for illustrative purposes, and the present disclosure is not limited thereto. In some embodiments, additional quadrant control signal(s) may be employed to switch the quadrants corresponding to the phase of the output clock signal CKO.

Figure 3A:
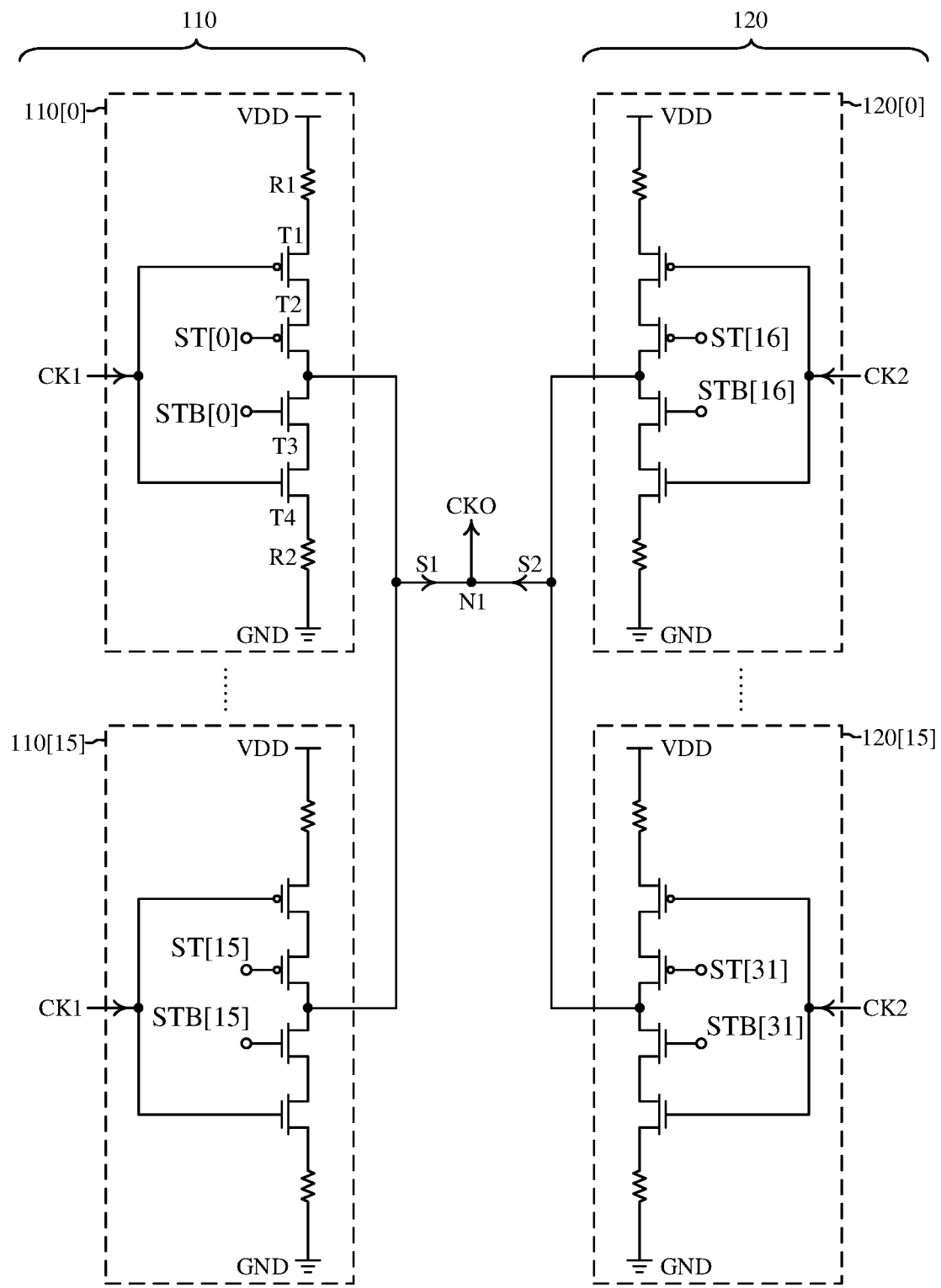
FIG. 3A illustrates a circuit diagram of phase interpolator circuitries in FIG. 1 according to some embodiments of the present disclosure.
Figure 3B:
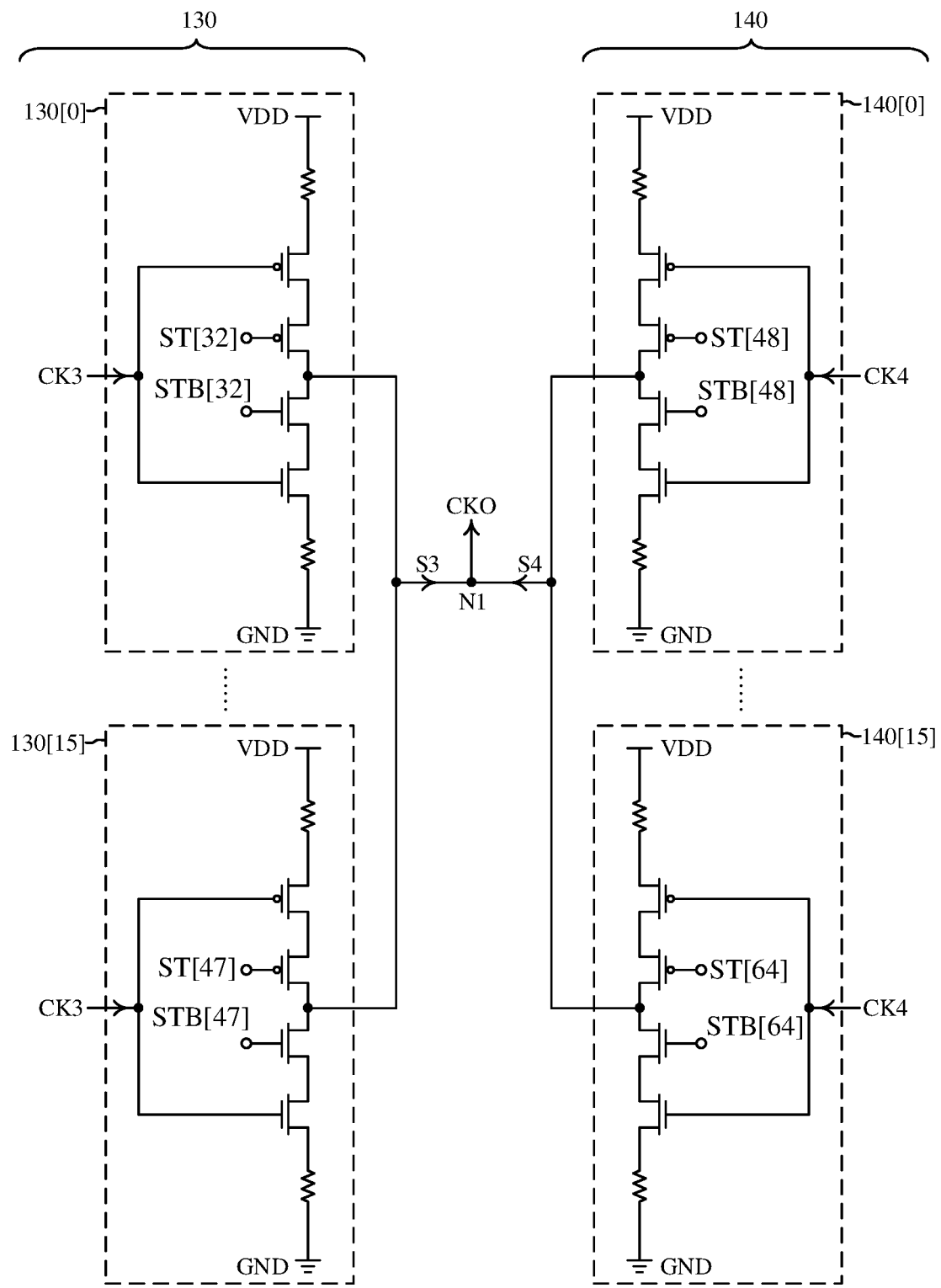
FIG. 3B illustrates a circuit diagram of phase interpolator circuitries in FIG. 1 according to some embodiments of the present disclosure.

FIG. 3A illustrates a circuit diagram of the phase interpolator circuitry 110 and the phase interpolator circuitry 120 in FIG. 1 according to some embodiments of the present disclosure, and FIG. 3B illustrates a circuit diagram of the phase interpolator circuitry 130 and the phase interpolator circuitry 140 in FIG. 1 according to some embodiments of the present disclosure. It is understood that, the phase interpolator circuitry 110 and the phase interpolator circuitry 120 in FIG. 3A and the phase interpolator circuitry 130 and the phase interpolator circuitry 140 in FIG. 3B together form the phase interpolator 100 in FIG. 1.

As shown in FIG. 3A, the phase interpolator circuitry 110 includes phase buffer circuits 110[0]-110[15]. Each of the phase buffer circuits 110[0]-110[15] receives a corresponding one of the phase control bits ST[0]-ST[15] (hereinafter referred to as a first bit), a corresponding one of the phase control bits STB[0]-STB[15] (hereinafter referred to as a second bit), and the clock signal CK1. Each of the phase buffer circuits is configured to be turned on according to the first bit and the second bit, in order to generate a portion of the signal component S1 according to the clock signal CK1. For example, the phase buffer circuit 110[0] receives the phase control bit ST[0] (i.e., the first bit), the phase control bit STB[0] (i.e., the second bit), and the clock signal CK1 to generate a portion of the signal component S1. The phase buffer circuit 110[15] receives the phase control bit ST[15] (i.e., the first bit), the phase control bit STB[15] (i.e., the second bit), and the clock signal CK1 to generate a portion of the signal component S1. With this analogy, it is understood that the corresponding relations among the phase buffer circuits 110[0]-110[15],the phase control bits ST[0]-ST[15], and the phase control bits STB[0]-STB[15].

Similarly, the phase interpolator circuitry 120 includes phase buffer circuits 120[0]-120[15]. Each of the phase buffer circuits 120[0]-120[15] receives a corresponding one of the phase control bits ST[16]-ST[31], a corresponding one of the phase control bits STB[16]-STB[31], and the clock signal CK2, and the phase buffer circuits 120[0]-120[15] are configured to generate the signal component S2 in response to the phase control bits ST[16]-ST[31], the phase control bits STB[16]-STB[31], and the clock signal CK2. The corresponding relations among the phase buffer circuits 120[0]-120[15], the phase control bits ST[16]-ST[31], and the phase control bits STB[16]-STB[31] can be understood with reference to the arrangements of the phase interpolator circuitry 110, and thus the repetitious descriptions are not further given.

Each of the phase buffer circuits 110[0]-110[15] and 120[0]-120[15] has the same circuit structure. Taking the phase buffer circuit 110[0] as an example, the phase buffer circuit 110[0] includes a resistor R1 and a resistor R2. The phase buffer circuit 110[0] is configured to selectively transmit the first voltage to the output node N1 via the resistor R1 or transmit the second voltage to the output node N1 via the resistor R2. In some embodiments, the first voltage is higher than the second voltage. For example, the first voltage may be the supply voltage VDD, and the second voltage may be a ground voltage GND. With the such arrangements, the resistor R1 and the resistor R2 may set the common mode level of the output node N1.

In greater detail, the phase buffer circuit 110[0] further includes switches T1-T4. A firster terminal of the resistor R1 receives the supply voltage VDD, and another terminal of the resistor R1 is coupled to a first terminal of the switch T1 (e.g., source). A second terminal of the switch T1 (e.g., drain) is coupled to a first terminal of the switch T2, and a control terminal of the switch T1 (e.g., gate) receives the clock signal CK1. The switch T1 is selectively turned on in response to the clock signal CK1. A second terminal of the switch T2 is coupled to a first terminal of the switch T3 (e.g., drain) and the output node N1, and the control terminal of the switch T2 receives the phase control bit ST[0]. The switch T2 may be selectively turned on in response to the phase control bit ST[0], in order to generate a portion of the signal component S1 to the output node N1. A second terminal of the switch T3 (e.g., source) is coupled to a first terminal of the switch T4, and a control terminal of the switch T3 (e.g., gate) receives the phase control bit STB[0]. The switch T3 may be selectively turned on in response to the phase control bit STB[0], in order to generate a portion of the signal component S1 to the output node N1. A terminal of the resistor R2 receives the ground voltage GND, a terminal of the switch T4 receives another one terminal of the resistor R2, and a control terminal of the switch T4 receives the clock signal CK1. The switch T4 is selectively turned on in response to the clock signal CK1.

In some embodiments, the switches T1 and T2 are P-type transistors, and the switches T3 and T4 are N-type transistors. When the phase control bit ST[0] has the predetermined logic value (e.g., the logic value of 0) and the clock signal CK1 has a low level, the switches T1 and T2 are turned on. Under this condition, the supply voltage VDD may be transmitted to the output node N1 via the resistor R1. In other words, when the switches T1 and T2 are all turned on, the phase buffer circuit 110[0] may output the signal component (i.e., a portion of the signal component Si) having a high level (i.e., the supply voltage VDD) to the output node N1. Alternatively, when the phase control bit ST[0] has the predetermined logic value (e.g., the logic value of 0) and the clock signal CK1 has the high level, the switches T3 and T4 are turned on. Under this condition, the ground voltage GND may be transmitted to the output node N1 via the resistor R2. In other words, when the switches T3 and T4 are all turned on, the phase buffer circuit 110[0] may output the signal component (i.e., a portion of the signal component Si) having a low level (i.e., the ground voltage GND) to the output node N1. With this analogy, it is able to understand the relevant operations of the remaining phase buffer circuits 110[1]-110[15] and 120[0]-120[15].

In some related approaches, phase buffer circuits in a phase interpolator are implemented with current-mode logic circuits. In those approaches, each current-mode logic circuit is implemented with a differential input pair and a current source circuit, and convert currents generated from all current-mode logic circuits by resistor(s) to generate an output clock signal. As offsets of the current source circuit and those of the resistor(s) which caused from process variations are different, the output common mode level of the phase interpolator is thus inaccurate. Moreover, if the output clock signal has a higher swing, the transistor(s) in the differential input pair and/or the current source circuit may operate in the nonlinear region mistakenly, which results in a distortion of the swing of the output clock signal (i.e., the linearity is decreased).

Compared the above approaches, in some embodiments of the present disclosure, the resistors R1 and R2 may divide the supply voltage VDD and the ground voltage GND, in order to set the common mode level of the output node N1. For example, as the supply voltage VDD and the ground voltage GND are DC voltages, the supply voltage VDD and the ground voltage GND may be divided via the resistors R1-R2 and the switches T1-T4 (even if the switches T1-T4 are not turned on) to set the common mode level of the output node N1. In some embodiments, the resistance value of each of the resistors R1-R2 may be higher than the equivalent resistance value of each switches T1-T4. As a result, the division result of the supply voltage VDD and the ground voltage GND is mainly determined by the resistors R1-R2. Accordingly, even if offsets on the P-type transistors are different from those on the N-type transistors, the common mode level of the output node N1 is still set by the resistors R1-R2. In some embodiments, the resistors R1 and R2 may implemented with the same or the similar layout designs. For example, each of the resistors R1-R2 may be, but not limited to, implemented with polysilicon resistors. With the above arrangements, the offsets on the resistors R1-R2 under process variations may be similar, in order assure that the common mode level of the output node N1 is kept stable (e.g., kept being at a half of the sum of the supply voltage VDD and the ground voltage GND). As a result, it can assure that the swing of the output clock signal CKO is kept being symmetric.

Furthermore, as shown in FIG. 3A, in the phase buffer circuit 110[0], certain switches (i.e., switches T2-T3) are directly connected to the output node N1, and another switches (i.e., switches T1 and T4) are not directly connected to the output node N1. In some embodiments, the switches T2-T3 receive the phase control bits ST[0] and STB[0] and do not receive the clock signal CK1, and the switches T1 and T4 receive the clock signal CK1 and are selectively turned on in response to the clock signal CK1. With such arrangements, the certain switches that are directly connected to the output node N1 are selectively turned on in response to the phase control bits ST[0] and STB[0] (rather than the clock signal CK1). As a result, the switching of the clock signal CK1 do not directly affect the output node N1, which results a lower jitter on the output clock signal CKO during the phase switching progress.

As shown in FIG. 3B, the phase interpolator circuitry 130 includes phase buffer circuits 130[0]-130[15], and the phase interpolator circuitry 140 includes phase buffer circuits 140[0]-140[15]. Each of the phase buffer circuits 130[0]-130[15] receives a corresponding one of the phase control bits ST[32]-ST[47], a corresponding one of the phase control bits STB[32]-STB[47], and the clock signal CK3. The phase buffer circuits 130[0]-130[15] are configured to generate the signal component S3 in response to the phase control bits ST[32]-ST[47] and STB[32]-STB[47] and the clock signal CK3. Each of the phase buffer circuits 140[0]-140[15] receives a corresponding one of the phase control bits ST[48]-ST[63], a corresponding one of the phase control bits STB[48]-STB[63], and the clock signal CK4. The phase buffer circuits 140[0]-140[15] are configured to generate the signal component S4 in response to the phase control bits ST[48]-ST[63] and STB[48]-STB[63] and the clock signal CK4.

Each of the phase buffer circuits 110[0]-110[15], 130[0]-130[15], and 140[0]-140[15] has the same circuit architecture. The arrangements and/or operations of the phase buffer circuits 130[0]-130[15] and 140[0]-140[15] are the same as those of the phase buffer circuits 140[0]-140[15], and thus the repetitious descriptions are not further given.

As mentioned above, in some embodiments, additional quadrant control signals may be further employed to switch the quadrant corresponding to the phase of the output clock signal CKO. In those embodiments, additional phase multiplexer(s) may be employed to perform quadrant switching, in order to reduce the number of the phase buffer circuits. As a result, it may further reduce the number of the resistors, in order to save circuit area.

As described above, the phase interpolator and the phase buffer circuit in some embodiments of the present disclosure may utilize resistor(s) to set the common mode level of the node that generates the output clock signal. As a result, the linearity and the available swing of the clock output signal can be maintained under the impacts from process variations.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely the preferred embodiments of the present disclosure, without any intention to limit the scope of the present disclosure thereto. Various equivalent changes, alterations, or modifications based on the claims of the present disclosure are all consequently viewed as being embraced by the scope of the present disclosure.

What is claimed is:

1. A phase interpolator, comprising:
a plurality of phase interpolator circuitries configured to generate an output clock signal from an output node in response to a plurality of phase control bits and a plurality of clock signals,
wherein phases of the plurality of clock signals are different from each other, each of the plurality of phase interpolator circuitries comprises a plurality of phase buffer circuits, each of the plurality of phase buffer circuits is configured to be turned on according to a first bit and a second bit in the plurality of phase control bits, in order to generate a signal component of the output clock signal to the output node according to a corresponding clock signal in the plurality of clock signals, each of the plurality of phase buffer circuits comprises a first resistor, a second resistor, and a plurality of switches and is configured to transmit one of a first voltage and a second voltage to the output node according to the corresponding clock signal, the plurality of switches are coupled between the first resistor and the second resistor, the first voltage is transmitted to the output node via the first resistor and a first group of switches in the plurality of switches, the second voltage is transmitted to the output node via the second resistor and a second group of switches in the plurality of switches, and the first resistor and the second resistor are configured to set a common mode level of the output node.

2. The phase interpolator of claim 1, wherein the first voltage is higher than the second voltage.

3. The phase interpolator of claim 1, wherein the first bit is opposite to the second bit.

4. The phase interpolator of claim 1, wherein each of the plurality of phase buffer circuits further comprises a plurality of switches, the plurality of switches are coupled between the first resistor and the second resistor, and some of the plurality of switches are directly connected to the output node and do not receive the corresponding clock signal.

5. The phase interpolator of claim 4, wherein the some of the plurality of switches are configured to receive the first bit and the second bit.

6. The phase interpolator of claim 1, wherein each of the plurality of phase buffer circuits further comprises a plurality of switches, the plurality of switches are coupled between the first resistor and the second resistor, and some of the plurality of switches are not directly connected to the output node and are selectively turned on in response to the corresponding clock signal.

7. The phase interpolator of claim 1, wherein each of the plurality of phase buffer circuits further comprises:
- a first switch coupled to the first resistor and configured to be selectively turned on in response to the corresponding clocks signal;
- a second switch coupled to the first switch and configured to be selectively turned on in response to the first bit, in order to generate the signal component and transmit the signal component to the output node;
- a third switch coupled to the second switch and configured to be selectively turned on in response to the second bit, in order to generate the signal component and transmit the signal component to the output node; and
- a fourth switch coupled between the second resistor and the third switch and configured to be selectively turned on in response to the corresponding clock signal.

8. A phase buffer circuit, comprising:
- a first resistor, wherein a terminal of the first resistor is configured to receive a first voltage;
- a second resistor, wherein a terminal of the second resistor is configured to receive a second voltage, and the first resistor and the second resistor are configured to set a common mode level of an output node;
- a first switch, wherein a first terminal of the first switch is coupled to another terminal of the first resistor, and a control terminal of the first switch is configured to receive a clock signal;
- a second switch, wherein a first terminal of the second switch is coupled to a second terminal of the first switch, a second terminal of the second switch is coupled to the output node to generate a signal component, and a control terminal of the second switch is configured to receive a first phase control bit;
- a third switch, wherein a first terminal of the third switch is coupled to the output node, and a control terminal of the third switch is configured to receive a second phase control bit; and
- a fourth switch, wherein a first terminal of the fourth switch is coupled to a second terminal of the third switch, a second terminal of the fourth switch is coupled to another terminal of the second resistor, and a control terminal of the fourth switch is configured to receive the clock signal.

9. The phase buffer circuit of claim 8, wherein the first voltage is higher than the second voltage.

10. The phase buffer circuit of claim 8, wherein the first phase control bit is opposite to the second phase control bit.

11. The phase buffer circuit of claim 8, wherein the second switch and the third switch do not directly receive the clock signal.

* * * * *